(12) United States Patent
Ahn et al.

(10) Patent No.: US 10,134,854 B2
(45) Date of Patent: Nov. 20, 2018

(54) HIGH ELECTRON MOBILITY TRANSISTOR AND FABRICATION METHOD THEREOF

(71) Applicant: ELECTRONICS AND TELECOMMUNICATIONS RESEARCH INSTITUTE, Daejeon (KR)

(72) Inventors: Ho Kyun Ahn, Daejeon (KR); Dong Min Kang, Daejeon (KR); Yong-Hwan Kwon, Daejeon (KR); Dong-Young Kim, Daejeon (KR); Seong Il Kim, Daejeon (KR); Hae Cheon Kim, Daejeon (KR); Eun Soo Nam, Daejeon (KR); Jae Won Do, Daejeon (KR); Byoung-Gue Min, Sejong-si (KR); Hyung Sup Yoon, Daejeon (KR); Sang-Heung Lee, Daejeon (KR); Jong Min Lee, Daejeon (KR); Jong-Won Lim, Daejeon (KR); Hyun Wook Jung, Daejeon (KR); Kyu Jun Cho, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 134 days.

(21) Appl. No.: 15/248,676

(22) Filed: Aug. 26, 2016

(65) Prior Publication Data
US 2017/0236909 A1 Aug. 17, 2017

(30) Foreign Application Priority Data
Feb. 12, 2016 (KR) .................. 10-2016-0016435

(51) Int. Cl.
*H01L 29/40* (2006.01)
*H01L 29/20* (2006.01)
(Continued)

(52) U.S. Cl.
CPC ........ *H01L 29/404* (2013.01); *H01L 29/2003* (2013.01); *H01L 29/205* (2013.01);
(Continued)

(58) Field of Classification Search
None
See application file for complete search history.

(56) References Cited

U.S. PATENT DOCUMENTS 7,573,078 B2 * 8/2009 Wu ..................... H01L 29/404
257/192
7,696,535 B2 * 4/2010 Yang ................... H01L 29/7787
257/194

(Continued)

FOREIGN PATENT DOCUMENTS

KR       10-0782430 B1   12/2007
KR   10-2013-0031771 A    3/2013
(Continued)

OTHER PUBLICATIONS

Puneet Srivastava et al., "Record Breakdown Voltage (2200V) of GaN DHFETs on Si With 2-μm Buffer Thickness by Local Substrate Removal", IEEE Electron Device Letters, vol. 32, No. 1, pp. 30-32, Jan. 2011.
(Continued)

*Primary Examiner* — Michael Lebentritt
*Assistant Examiner* — Jordan Klein
(74) *Attorney, Agent, or Firm* — Rabin & Berdo, P.C.

(57) ABSTRACT

A high electron mobility transistor includes a substrate including a first surface and a second surface facing each other and having a via hole passing through the first surface
(Continued)

and the second surface, an active layer on the first surface, a cap layer on the active layer and including a gate recess region exposing a portion of the active layer, a source electrode and a drain electrode on one of the cap layer and the active layer, an insulating layer on the source electrode and the drain electrode and having on opening corresponding to the gate recess region to expose the gate recess region, a first field electrode on the insulating layer, a gate electrode electrically connected to the first field electrode on the insulating layer, and a second field electrode on the second surface and contacting the active layer through the via hole.

10 Claims, 7 Drawing Sheets

(51) Int. Cl.
*H01L 29/205* (2006.01)
*H01L 29/778* (2006.01)
*H01L 29/66* (2006.01)

(52) U.S. Cl.
CPC ...... *H01L 29/401* (2013.01); *H01L 29/66462* (2013.01); *H01L 29/7787* (2013.01)

(56) References Cited

U.S. PATENT DOCUMENTS

| | | | |
|---|---|---|---|
| 8,901,608 B2* | 12/2014 | Lim | H01L 29/778 257/194 |
| 2006/0060895 A1* | 3/2006 | Hikita | H01L 29/41766 257/280 |
| 2013/0069127 A1* | 3/2013 | Ahn | H01L 29/402 257/288 |
| 2013/0228790 A1* | 9/2013 | Yamamura | H01L 29/2003 257/76 |
| 2015/0194494 A1* | 7/2015 | Ahn | H01L 29/402 257/409 |
| 2015/0294921 A1* | 10/2015 | Viswanathan | H01L 23/367 257/76 |

FOREIGN PATENT DOCUMENTS

| | | |
|---|---|---|
| KR | 10-1343770 B1 | 12/2013 |
| KR | 10-2015-0065068 A | 6/2015 |
| WO | WO-2007-014036 A2 | 2/2007 |

OTHER PUBLICATIONS

Eizo Mitani et al., "Mass-Production of High-Voltage GaAs and GaN Devices", CS Mantech Conference, pp. 183-186, Apr. 24-27, 2006.

Eldad Bahat-Treidel et al., "AlGaN/GaN/AlGaN DH-HEMTs Breakdown Voltage Enhancement Using Multiple Grating Field Plates (MGFPs)", IEEE Transactions on Electron Devices, vol. 57, No. 6, pp. 1208-1216, Jun. 2010.

* cited by examiner

HIGH ELECTRON MOBILITY TRANSISTOR AND FABRICATION METHOD THEREOF

CROSS-REFERENCE TO RELATED APPLICATION

The present application claims priority to Korean patent application number 10-2016-0016435 filed on Feb. 12, 2016, the entire disclosure of which is incorporated herein in its entirety by reference.

BACKGROUND

Field of Invention

Various embodiments of the inventive concept of the present disclosure relate to a high electron mobility transistor and a fabrication method thereof.

Description of Related Art

Gallium nitride (GaN) has wide bandgap characteristics and high breakdown voltage characteristics. Thus, when a transistor is formed using gallium nitride (GaN), excellent breakdown characteristics of a device may be ensured. In addition, a gallium nitride (GaN)-based device may have high frequency characteristics since it has higher electronic mobility and saturated electron velocity than a silicon-based device which is currently in widespread use. This high electron mobility of the GaN-based device may result in lower on-resistance characteristics when a high electron mobility transistor (HEMT) is manufactured using gallium nitride (GaN). Low on-resistance characteristics may enable a transistor with low loss.

As described above, since a gallium nitride (GaN)-based high electron mobility transistor (HEMT) has sufficient advantages as a device requiring high-frequency high-power characteristics, continued research is required.

SUMMARY

Various embodiments of the present disclosure are to fabricate a high electron mobility transistor minimizing a current collapse phenomenon, reducing leakage current and improving a breakdown voltage.

Various embodiments of the present disclosure are to provide a method of fabricating a high electron mobility transistor.

According to an embodiment, there is provided a high electron mobility transistor, including a substrate including a first surface and a second surface facing each other and having a via hole passing through the first surface and the second surface, an active layer disposed on the first surface of the substrate, a cap layer disposed on the active layer and including a gate recess region exposing a portion of the active layer, a source electrode and a drain electrode disposed on one of the cap layer and the active layer and forming an ohmic contact, an insulating layer disposed on the source electrode and the drain electrode and having on opening corresponding to the gate recess region to expose the gate recess region, a first field electrode disposed on the insulating layer and located between the source electrode the drain electrode, a gate electrode is electrically connected to the first field electrode on the insulating layer, and a second field electrode disposed on the second surface of the substrate and contacting the active layer through the via hole.

The second field electrode disposed on the second surface of the substrate may correspond to a region between the gate electrode and the drain electrode.

The second field electrode may be disposed in the via hole.

The via hole may pass through the substrate and the portion of the active layer disposed on the substrate.

The second field electrode may include at least one of metal, a conductive material, an alloy, a conductive oxide, or a conductive metal nitride.

The second field electrode may be electrically connected to at least one of the source electrode or the gate electrode.

The gate electrode and the first field electrode may include a same material.

The gate electrode may include a gate foot passing through the gate recess region and the opening, and a gate head supported by the gate foot and the insulating layer.

The first field electrode may extend in a direction from the gate head to the drain electrode.

The high electron mobility transistor may further include a passivation layer disposed on the second field electrode.

According to another embodiment, there is provided a method of fabricating a high electron mobility transistor, the method including sequentially forming an active layer and a cap layer on a first surface of a substrate, forming a source electrode and a drain electrode on the cap layer and making an ohmic contact with one of the cap layer and the active layer, sequentially forming an insulating layer and a first photoresist film on the source electrode and the drain electrode, forming a first photosensitive film pattern by patterning the first photoresist film, wherein the first photosensitive film pattern includes a first photoresist film opening through which a portion of the insulating layer is externally exposed, etching the insulating layer by using the first photosensitive film pattern as an etch mask, wherein the insulating layer is etched to include an opening corresponding to the first photoresist film opening and externally exposing the cap layer, forming a second photoresist film on the insulating layer including the opening, forming a second photosensitive film pattern including a second photoresist film opening for a gate electrode by patterning the second photoresist film, forming a gate recess region exposing a portion of an upper surface of the active layer by etching the cap layer by using the second photosensitive film pattern as an etch mask, forming a gate electrode and a first field electrode by depositing a first metal layer onto the gate recess region and the insulating layer, arranging the etch mask on a second surface facing the first surface of the substrate, forming a via hole exposing a rear surface of the active layer by partially etching the second surface of the substrate, and forming a second field electrode contacting the rear surface of the active layer by forming a second metal layer on the second surface of the substrate.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
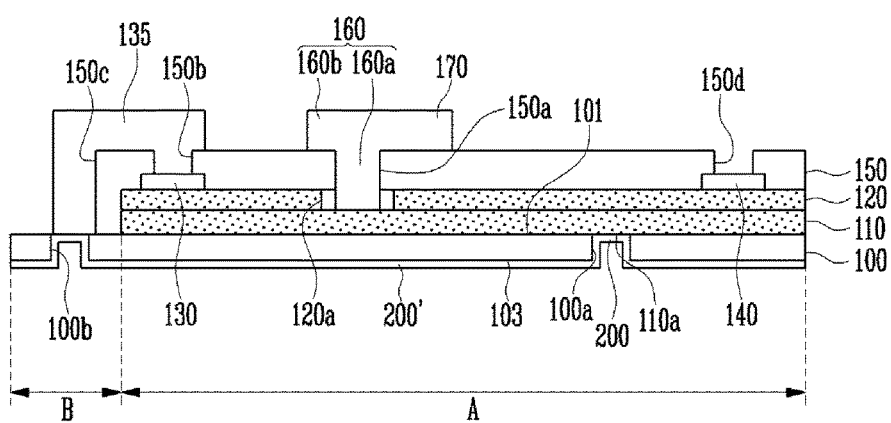
FIG. 1 is a cross-sectional view illustrating a high electron mobility transistor according to an embodiment.

Various modifications and changes may be applied to the examples of embodiments in accordance with the concepts so that the examples of embodiments will be illustrated in the drawings and described in the specification. However, the examples of embodiments according to the concepts are not limited to the specific embodiments, but include all changes, equivalents, or alternatives which are included in the spirit and technical scope of the present disclosure.

In the drawings, the thicknesses of layers and regions are exaggerated for clarity. Like reference numerals in the drawings denote like elements, and thus their description will be omitted. Also, though terms like a first and a second are used to describe various compositions in various embodiments of the present invention, the compositions are not limited to these terms. For example, without being out of the scope, a first component in one embodiment can be referred to as a second component in another embodiment, and similarly, the second component can be referred to as the first component. The terms of a singular form may include plural forms unless referred to the contrary.

The meaning of "include," "comprise," "including," or "comprising," specifies a property, a region, a fixed number, a step, a process, an element and/or a component but does not exclude other properties, regions, fixed numbers, steps, processes, elements and/or components. In the description of embodiments, it will be understood that when a layer (or film) is referred to as being 'on/over' another layer or substrate, it can be directly on the layer or substrate, or intervening layers may also be present. In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'.

Hereinafter, embodiments of the invention will be described in detail with reference to the accompanying drawings.

FIG. 1 is a cross-sectional view illustrating a high electron mobility transistor according to an embodiment.

Referring to FIG. 1, a high electron mobility transistor according to an embodiment may include a substrate 100, an active layer 110, a cap layer 120, a source electrode 130, a drain electrode 140, an insulating layer 150, a gate electrode 160, a first field electrode 170, a pad portion 135, a metal layer 200' and a second field electrode 200.

The substrate 100 may be a silicon (Si) substrate, a silicon carbide (SiC) substrate, a high-resistivity silicon substrate or a wafer including an epi-structure such as nucleation layer and buffer layer.

The active layer 110 may be disposed on a first surface (e.g., front surface 101) of the substrate 100 and form a channel region between the source electrode 130 and the drain electrode 140. The active layer 110 may be a semiconductor layer. For example, the active layer 110 may include at least one of various materials including gallium nitride (GaN), indium gallium nitride (InGaN) and aluminum gallium nitride (AlGaN).

However, the invention is not limited thereto. The active layer 110 may be a material layer including any material that can form a two-dimensional electron gas (hereinafter, referred to as "2DEG") in the active layer 110. The active layer 110 may be an undoped layer. However, the active layer 110 may be doped with predetermined impurities. The active layer 110 may have a thickness of several micrometers (μm) or less. The active layer 110 may include a buffer layer which is a semiconductor material layer and a barrier layer which is another semiconductor material layer. At least one of polarization characteristics, energy bandgap and lattice constant of the barrier layer may be different from that of the buffer layer. The active layer 110 may have a structure forming a heterojunction of two materials. For example, the barrier layer may include a material (semiconductor) having greater polarizability and/or energy bandgap than the buffer layer. For example, the barrier layer may have a single layer or multilayer structure including at least one material selected from nitrides including at least one of aluminum (Al), gallium (Ga), indium (In) and boron (B). For example, the barrier layer may have a single-layer or multilayer structure including at least one of aluminum gallium nitride (AlGaN), aluminum indium nitride (AlInN), indium gallium nitride (InGaN), aluminum nitride (AlN), and aluminum indium gallium nitride (AlInGaN). The buffer layer may have a thickness of several micrometers (μm) or less and the barrier layer may have a thickness of several nanometers (nm) or less.

The cap layer 120 may be disposed over the active layer 110 to protect the surface or improve ohmic contact characteristics. The cap layer 120 may be an undoped layer. However, the cap layer 120 may be doped with predetermined impurities to improve ohmic contact characteristics. A compound semiconductor layer, such as a gallium nitride (GaN) or gallium arsenide (GaAs) layer, may be applied as the cap layer 120. The cap layer 120 may have a thickness of several nanometers (nm) or less in a heterojunction structure of aluminum gallium nitride (AlGaN)/gallium nitride (GaN). The cap layer 120 may include a gate recess region 120a partially exposing the active layer 110 to the outside.

The 2DEG may be formed in at least a portion of the active layer 110. The 2DEG may be formed in a buffer layer region under an interface between the barrier layer and the buffer layer of the active layer 110. The 2DEG formed in the active layer 110 may serve as a current path between the source electrode 130 and the drain electrode 140, i.e., a channel region. The cap layer 120 may be removed.

As viewed in the plane, the substrate 100 may be divided into a device area A where the 2DEG is present and an isolation area B where the 2DEG is not present. The device area A of the substrate 100 may include a first via hole 100a passing through the first surface 101 and a second surface (e.g., rear surface 103) of the substrate 100. The isolation area B of the substrate 100 may include a second via hole 100b passing through the first surface 101 and the second surface 103 of the substrate 100.

The source electrode 130 and the drain electrode 140 may be arranged into various structures such that the 2DEG may be used as a channel. For example, as shown in FIG. 1, the source electrode 130 and the drain electrode 140 may form an ohmic contact on the cap layer 120. In another example, though not shown in FIG. 1, the source electrode 130 and the drain electrode 140 may be formed by etching the cap layer 120. In another example, though not shown in FIG. 1, after the cap layer 120 is etched to a predetermined thickness, the source electrode 130 and the drain electrode 140 may be formed in the corresponding region. When the high electron mobility transistor is a high electron mobility transistor (HEMT) using a gallium nitride (GaN)-based compound semiconductor, each of the source electrode 130 and the drain electrode 140 may include a metal layer in which Ti/Al/Ni/Au layers are sequentially deposited to a predetermined thickness. In addition, when the high electron mobility transistor is a high electron mobility transistor (HEMT) using a gallium arsenic (GaAs)-based compound semiconductor, each of the source electrode 130 and the drain electrode 140 may include a metal layer in which AuGe/Ni/Au layers are sequentially deposited to a predetermined thickness.

The insulating layer 150 may be formed over the source electrode 130 and the drain electrode 140 and be a single layer or a multilayer. The insulating layer 150 may include a material, such as silicon nitride (SiN), silicon oxide (SiO2), BCB (Benzocyclobutene) and a porous silica thin film, and protect the surface of a epi-wafer including the cap layer 120, the active layer 110 and the substrate 100. The kind and thickness of the insulating layer 150 may be determined by considering passivation effects and etch rates of photoresist films used during processes. The insulating layer 150 may be patterned to include an opening 150a corresponding to the gate recess region 120a and first and second etched grooves 150b and 150c for electrically connecting the source electrode 130 to the pad portion 135. In addition, the insulating layer 150 may be patterned to include a third etched groove 150d through which the drain electrode 140 is partially exposed.

The gate electrode 160 may be disposed between the source electrode 130 and the drain electrode 140. The gate electrode 160 may include a gate foot 160a and a gate head 160b. The gate foot 160a may pass through the gate recess region 120a and the opening 150a. The gate head 160b may be electrically connected to the gate foot 160a and disposed over the insulating layer 150. The gate foot 160a may contact the active layer 110.

The first field electrode 170 may be formed on the insulating layer 150, be electrically connected to the gate head 160b, and extend in a direction of the drain electrode 140. The first field electrode 170 may reduce the peak value of the electric field around the drain-side edge of the gate electrode 160, enabling the high electron mobility transistor to be operated at high driving voltage. The first field electrode 170 may include the same metal material as the gate electrode 160.

The metal layer 200' may be disposed over the entire second surface 103 of the substrate 100. The metal layer 200' may be electrically connected to the pad portion 135 through the second via hole 100b.

The pad portion 135 may be electrically connected to the source electrode 130 through the first and second etched grooves 150b and 150c.

The second field electrode 200 may be electrically connected to the metal layer 200' and contact a rear surface 110a of the active layer 110 through the first via hole 100a.

The second field electrode 200 and the metal layer 200' may include a single layer including one of titanium (Ti), aluminum (Al), nickel (Ni), gold (Au), platinum (Pt) and chromium (Cr), a multilayer including more than one material, or an alloy thereof.

Since the second field electrode 200 is electrically connected to the metal layer 200' and the pad portion 135, the second field electrode 200 may be electrically connected to the source electrode 130. When the metal layer 200' is set to a ground state, the source electrode 130 and the second field electrode 200 may be in ground states.

When a general high electron mobility transistor is switched from an off-state to an on-state, negative charges may be generated in a trap region existing below the surface of the cap layer 120 by electrons supplied from a gate electrode in an off-state. As a result, the 2DEG may be reduced in a portion of the channel region of the active layer 110, and an on-resistance may be increased to cause a current collapse phenomenon.

If the cap layer 120 is not present, when the high electron mobility transistor is switched from the off-state to the on-state, negative charges may be generated in a trap region below the surface of the active layer 110 by electrons supplied from the gate electrode in the off-state. Whether the cap layer 120 is present or not, when the high electron mobility transistor is switched from the off-state to the on-state, negative charges may be generated in a trap region below the buffer layer included in the active layer 110 by electrons supplied from the gate electrode in the off-state. As a result, the 2DEG may be reduced in a portion of the channel region of the active layer 110, and an on-resistance may be increased to cause a current collapse phenomenon.

However, in the high electron mobility transistor according to an embodiment, the second field electrode 200 may be disposed on the second surface 103 of the substrate 100 and set to a ground state, so that the current collapse phenomenon and the increase of the on-resistance value may be prevented.

In addition, the second field electrode 200 may improve a breakdown voltage of a device by reducing the peak value of the electric field around the drain-side edge of the gate electrode 160, enabling the high electron mobility transistor to be operated at high driving voltage.

As illustrated in FIG. 1, the first via hole 100a may be formed by etching the substrate 100 corresponding to a region between the source electrode 130 and the drain electrode 140. Though not shown in FIG. 1, in another example, the first via hole 100a may be formed by partially etching the buffer layer included in the active layer 110 as well as the substrate 100 corresponding to the region between the source electrode 130 and the drain electrode 140. The first via hole 100a may prevent leakage current in a direction from the active layer 110 to the substrate 100.

As described above, the high electron mobility transistor according to the embodiment may reduce leakage current under the active layer 110 by partially etching the substrate 100 corresponding to the region between the source electrode 130 and the drain electrode 140, and the second field electrode 200 formed on the second surface 103 of the substrate 100 may increase a breakdown voltage and reduce a current collapse phenomenon.

FIGS. 2 to 14 are cross-sectional diagrams sequentially illustrating a method of manufacturing a high electron mobility transistor according to an embodiment. A method of manufacturing a high electron mobility transistor according to an embodiment is described with reference to FIGS. 2 to 14.

Figure 2:
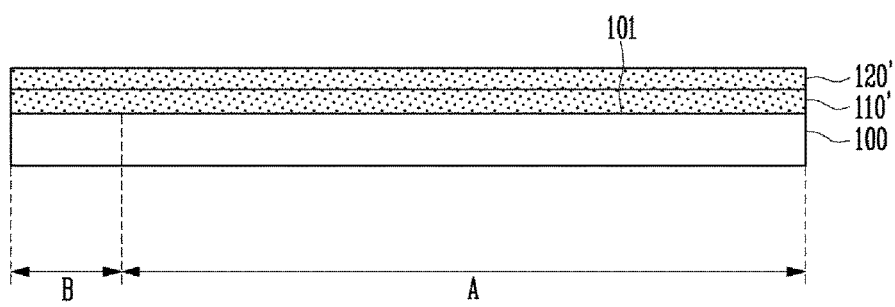
FIGS. 2 to 14 are cross-sectional diagrams sequentially illustrating a method of fabricating a high electron mobility transistor according to an embodiment.

Referring to FIG. 2, a first semiconductor material layer 110' and a second semiconductor material layer 120' may be sequentially formed on a first surface (e.g., front surface 101) of the substrate 100.

The substrate 100 may include, for example, a sapphire, silicon (Si), or silicon carbide (SiC) substrate, a high-resistivity silicon substrate or a wafer including an epi-structure such as nucleation layer and buffer layer. However, the substrate 100 may include various other materials.

A channel region may be formed in the first semiconductor material layer 110' between a source electrode and a drain electrode formed by processes to be described below. The first semiconductor material layer 110' may include at least one of various materials including gallium nitride (GaN), indium gallium nitride (InGaN), and aluminum gallium nitride (AlGaN). However, the invention is not limited thereto. The first semiconductor material layer 110' may include a heterojunction of two or more semiconductor material layers to form a two-dimensional electron gas (2DEG). The first semiconductor material layer 110' may be an undoped layer. However, the first semiconductor material layer 110' may be doped with predetermined impurities. In the heterojunction structure, the first semiconductor material layer 110' may include a barrier layer and a buffer layer.

The second semiconductor material layer 120' may be formed to protect the surface of the first semiconductor material layer 110' and/or improve ohmic contact characteristics. The second semiconductor material layer 120' may be an undoped layer. However, the second semiconductor material layer 120' may be doped with predetermined impurities to improve ohmic contact characteristics.

Figure 3:
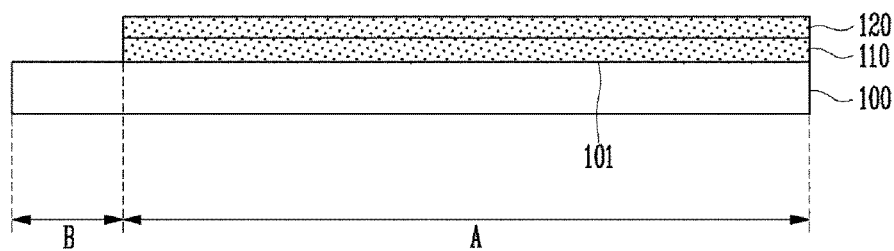

Referring to FIG. 3, the first semiconductor material layer 110' and the second semiconductor material layer 120' may be patterned to externally expose the isolation area B of the substrate 100. The active layer 110 and the cap layer 120 may be disposed on only the device area A of the substrate 100. In the isolation area B, the active layer 110 may be etched below the channel region, so that a portion of the active layer 110 may remain.

For example, in a high electron mobility transistor using a heterojunction of aluminum gallium nitride (AlGaN) and gallium nitride (GaN), the active layer 110 may include a gallium nitride buffer layer and an aluminum nitride barrier layer. The cap layer 120 may include a gallium nitride (GaN) layer.

Figure 4:
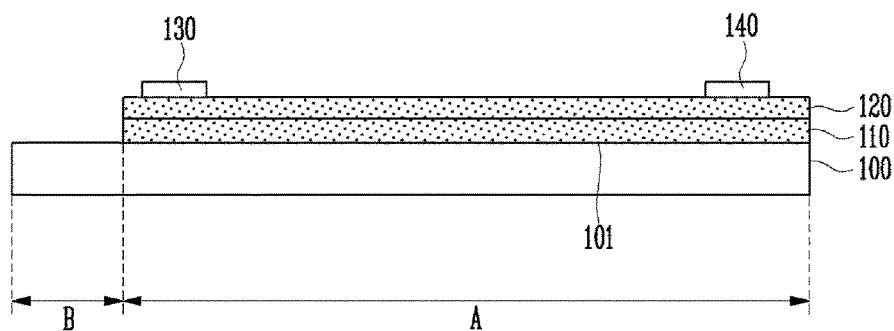

Referring to FIG. 4, the source electrode 130 and the drain electrode 140 forming an ohmic contact with the cap layer 120 may be formed on the cap layer 120.

The source electrode 130 and the drain electrode 140 may be spaced apart from each other by a predetermined distance and externally expose the cap layer 120 between the source electrode 130 and the drain electrode 140. For example, the source electrode 130 and the drain electrode 140 may be formed by forming ohmic metal on the cap layer 120 by using a vapor deposition device and performing rapid thermal annealing (RTA) thereon. The rapid thermal annealing may be performed in a range from 800° C. to 950° C. However, the invention is not limited thereto. When a high electron mobility transistor according to an embodiment is a high electron mobility transistor (HEMT) using a gallium nitride (GaN)-based compound semiconductor, the ohmic metal may include a metal layer in which Ti/Al/Ni/Au layers are sequentially deposited to a predetermined thickness. In addition, when the high electron mobility transistor is a high electron mobility transistor (HEMT) using a gallium arsenic (GaAs)-based compound semiconductor, the ohmic metal may include a metal layer in which AuGe/Ni/Au layers are sequentially deposited to a predetermined thickness.

Figure 5:
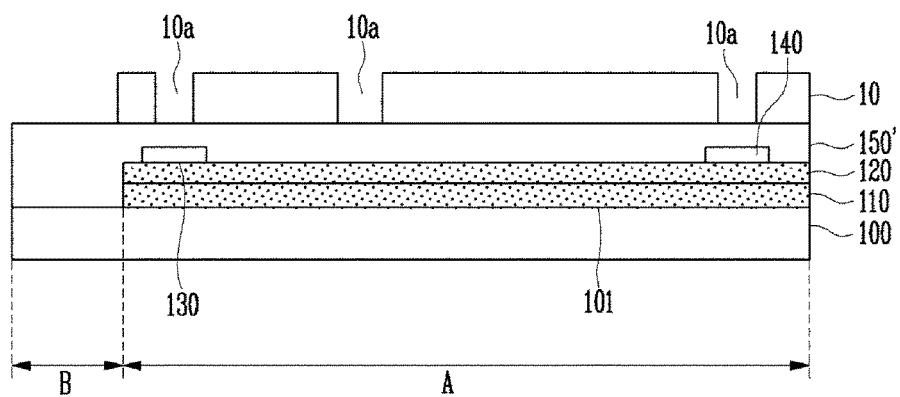

Referring to FIG. 5, an insulating material 150' may be deposited on the source electrode 130 and the drain electrode 140, and a first photosensitive film pattern 10 may be formed on the insulating material 150'.

The insulating material 150' may be formed as a single layer or a multilayer, and include silicon nitride (SiN), silicon oxide (SiO2), benzocyclobutene (BCB) and a porous silica thin film. The insulating material 150' may protect the surface of the substrate 100 and prevent a trapping phenomenon caused by a surface defect.

The first photosensitive film pattern 10 may be formed by forming a first photoresist film (not illustrated) on the insulating material 150' and patterning the first photoresist film to form a first photoresist film opening 10a partially exposing the insulating material 150'. For example, the first photosensitive film pattern 10 may be patterned using an electron beam lithography process. The first photosensitive film pattern 10 may include a multilayer photoresist film (not illustrated) of PMMA/Copolymer/PMMA or ZEP/PMGI/ZEP.

Figure 6:
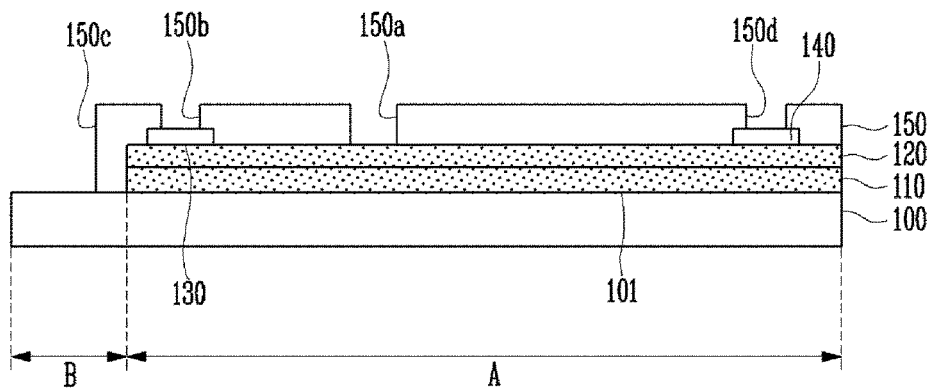

When an etch process of the insulating material 150' as shown in FIG. 5 is performed using the first photosensitive film pattern 10 as shown in FIG. 5 as an etch mask, the insulating layer 150 including the opening 150a and the first, second and third etched grooves 150b, 150c, and 150d as shown in FIG. 6. After the insulating layer 150 is formed, the first photosensitive film pattern 10 as shown in FIG. 5 may be removed.

The etch process may be performed using a dry etch method or a wet etch method, such as Reactive Ion Etching (RIE), Magnetically Enhanced Reactive Ion Etching (ME-RIE), or ICP (Inductive Coupled Plasma). When the etch process is performed using the dry etch method, $CF_4$, $CHF_3$ and a mixture gas of $CF_4$ and $O_2$ may be used.

A portion of the cap layer 120 may be externally exposed through the opening 150a, a portion of the source electrode 130 may be externally exposed through the first etched grooves 150b, the isolation area B of the substrate 100 may be externally exposed through the second etched groove 150c, and a portion of the drain electrode 140 may be externally exposed through the third etched groove 150d. The opening 150a may be formed to define a gate foot of a gate electrode to be formed during subsequent processes, and the first etched groove 150b may be formed to connect the source electrode 130 to a pad portion to be formed by subsequent processes.

Figure 7:
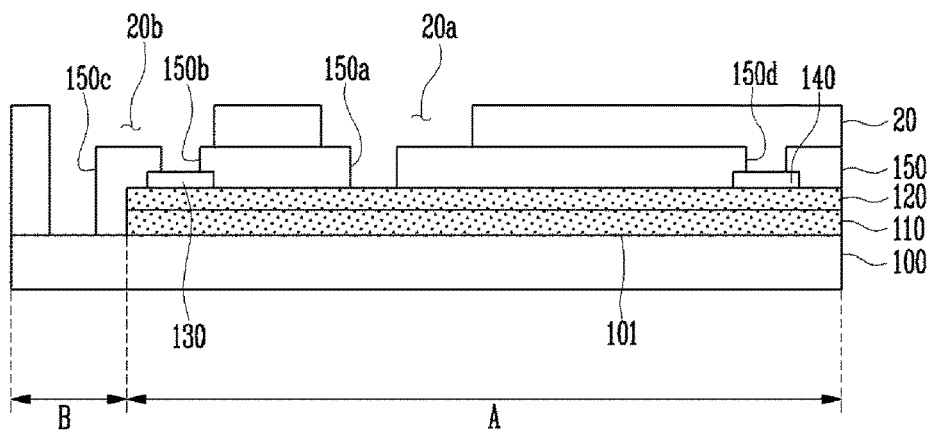

Referring to FIG. 7, a second photosensitive film pattern 20 may be formed on the insulating layer 150 to externally expose a portion of the insulating layer 150.

The second photosensitive film pattern 20 may include a second photoresist film opening 20a and a pad groove 20b. The second photoresist film opening 20a over the opening 150a may expose the portion of the insulating layer 150 and the cap layer 120. The pad groove 20b over the first and second etched grooves 150b and 150c of the insulating layer 150 may partially expose the insulating layer 150.

For example, the second photosensitive film pattern 20 may be manufactured using an electron beam lithography process. The second photosensitive film pattern 20 may include a multilayer photoresist film (not illustrated) of PMMA/Copolymer/PMMA or ZEP/PMGI/ZEP. The multilayer photoresist film may include a positive type composite layer, and the single layer photoresist film may be a negative type photosensitive material.

Figure 8:
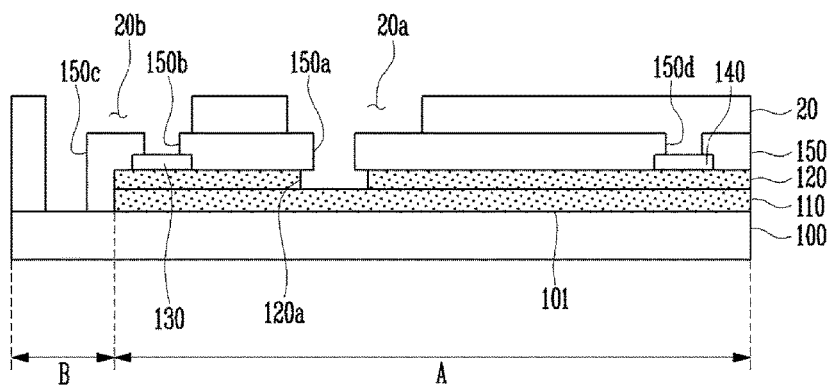

Referring to FIG. 8, by performing a gate recess process by using the second photosensitive film pattern 20 as an etch mask, the gate recess region 120a through which the active layer 110 is externally exposed may be formed.

The gate recess process may be performed using a wet method, a dry method, and a combination of the wet and dry methods through a single process or a plurality of processes, so that the externally exposed cap layer 120 may be etched through the opening 150a and the second photoresist film opening 20a to finally form the gate recess region 120a.

The gate recess process may be performed by dry etch equipment, such as electron cyclotron resonance (ECR) and inductive coupled plasma (ICP), by using gas such as $BCl_3$, $Cl_2$ and $SF_6$. In addition, when the high electron mobility thin film transistor is a gallium arsenic (GaAs)-based compound semiconductor device, the gate recess process may be performed using a wet etching solution, such as a phosphate solution in which $H_3PO_4$, $H_2O_2$ and $H_2O$ are mixed at an appropriate ratio.

Figure 9:
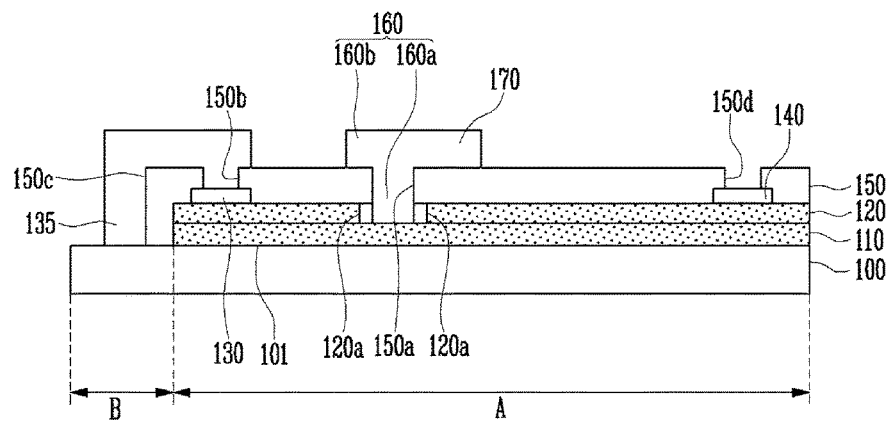

Referring to FIG. 9, after a first metal layer (not illustrated) is deposited onto the second photosensitive film pattern 20 as shown in FIG. 8, the second photosensitive film pattern 20 may be removed by a lift off process to form the gate electrode 160, the first field electrode 170 and the pad portion 135.

The gate electrode 160 may include the gate foot 160a and the gate head 160b. The gate foot 160a may pass through the gate recess region 120a and the opening 150a. The gate head 160b may be supported by the gate foot 160a and electrically connected to the gate foot 160a. The gate foot 160a may contact the active layer 110.

The first field electrode 170 may be electrically connected to the gate head 160b. The first field electrode 170 on the insulating layer 150 may extend in a direction from the gate head 160b to the drain electrode 140.

The first field electrode 170 may extend the gate head 160b in a direction of the drain electrode 140 to reduce resistance of the gate electrode 160. As a result, a field peak value between the gate electrode 160 and the drain electrode 140 may be reduced at an edge of the gate electrode 160 in a drain direction, so that a breakdown voltage of the high electron mobility transistor may be increased. In other words, the first field electrode 170 may reduce the peak value of the electric field around the drain-side edge of the gate electrode 160, enabling the high electron mobility transistor to be operated at high driving voltage.

When the high electron mobility transistor is in an off-state, negative charges supplied from the gate electrode 160 may be generated in a trap region below the surface of the active layer 110 to cause a current collapse phenomenon. The first field electrode 170 may be electrically connected to the gate electrode 160 and eliminate the negative charges by a positive voltage applied to the gate electrode 160 when the high electron mobility transistor is switched from the off-state to an on-state, thereby reducing the current collapse phenomenon.

The pad portion 135 may surround the first and second etched grooves 150b and 150c of the insulating layer 150 and be electrically connected to the source electrode 130.

Figure 10:
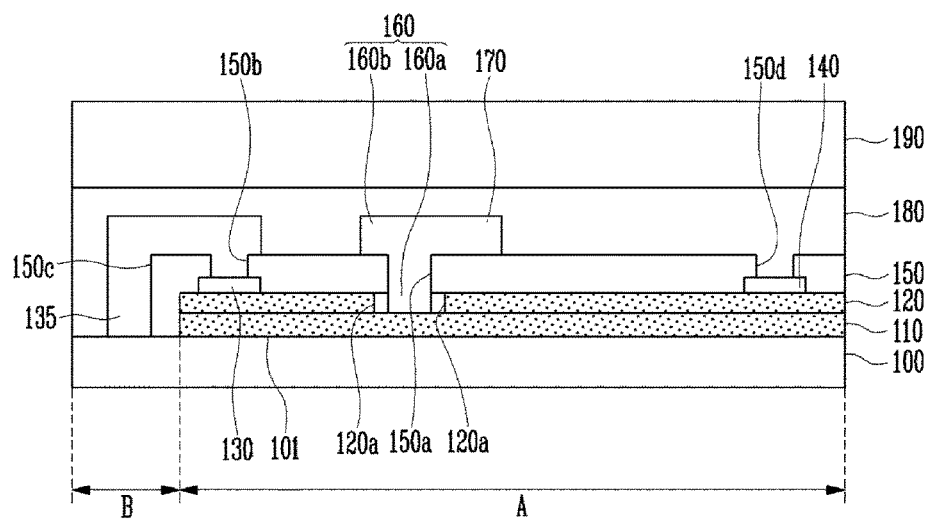

Referring to FIG. 10, the front surface of the substrate 100 on which the gate electrode 160, the first field electrode 170 and the pad portion 135 are formed may be coated with an adhesive material 180. In addition, after a carrier wafer 190 is disposed over the adhesive material 180, the substrate 100 and the carrier wafer 190 may be bonded to each other through the adhesive material 180.

Before the substrate 100 and the carrier wafer 190 are bonded to each other through the adhesive material 180, the entire first surface 101 of the substrate 100 may be coated with a protecting layer (not illustrated). After the protecting layer is coated, the substrate 100 and the carrier wafer 190 may be bonded to each other through the adhesive material 180.

The carrier wafer 190 may support the substrate 100 during a wafer thinning process of the substrate 100 which is a subsequent process.

Figure 11:
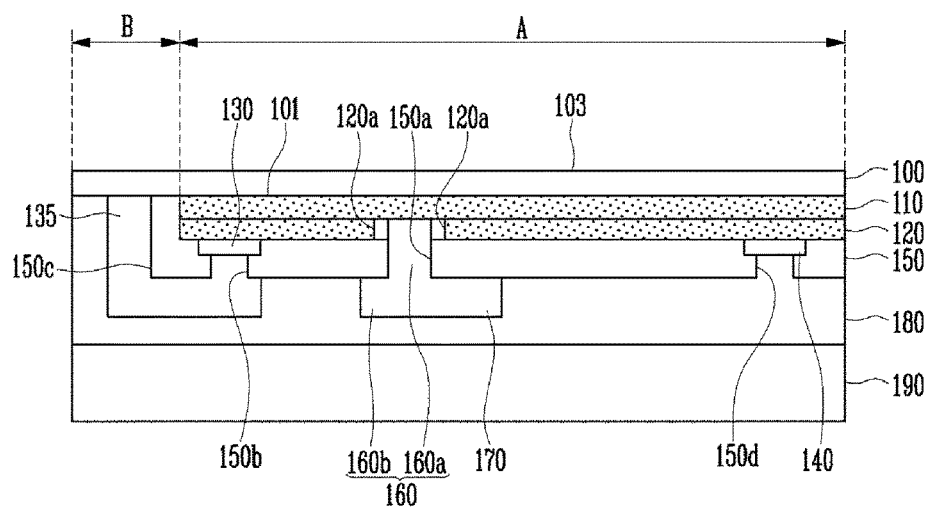

Referring to FIG. 11, by performing a wafer thinning process on the second surface 103 of the substrate 100 which is externally exposed without being bonded to the carrier wafer 190, the entire thickness of the substrate 100 may be reduced. For example, the substrate 100 may be reduced to a thickness of 100 μm or less by the wafer thinning process.

Figure 12:
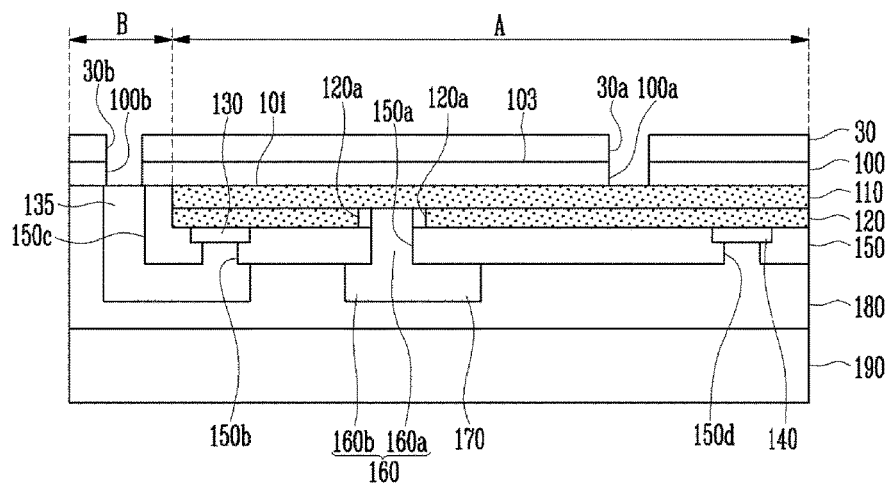

Referring to FIG. 12, an etch mask 30 may be disposed over the second surface 103 of the thinned substrate 100. The etch mask 30 may include a third etched groove 30a and a fourth etched groove 30b.

The etch mask 30 may be disposed to partially etch the substrate 100. A metal layer, a photoresist film and an insulating layer may be used depending on the type of the substrate 100. For example, when the substrate 100 is a silicon carbide (SiC) substrate, a nickel (Ni)-based metal layer may be used as the etch mask 30.

By etching the substrate 100 by using the etch mask 30, the first via hole 100a corresponding to the third etched groove 30a and the second via hole 100b corresponding to the fourth etched groove 30b may be formed. The first via hole 100a may pass through a portion of the buffer layer included in the active layer 110 as well as the first surface 101 and the second surface 103 of the substrate 100.

The first via hole 100a and the second via hole 100b may pass through the first surface 101 and the second surface 103 of the substrate 100. The first via hole 100a may be formed in the device area A of the substrate 100, and the second via hole 100b may be formed in the isolation area B of the substrate 100. The rear surface 110a of the active layer 110 disposed under the substrate 100 may be externally exposed through the first via hole 100a. The pad portion 135 may be externally exposed through the second via hole 100b. When the first via hole 100a and the second via hole 100b are finally formed in the substrate 100, the etch mask 30 may be removed.

Figure 13:
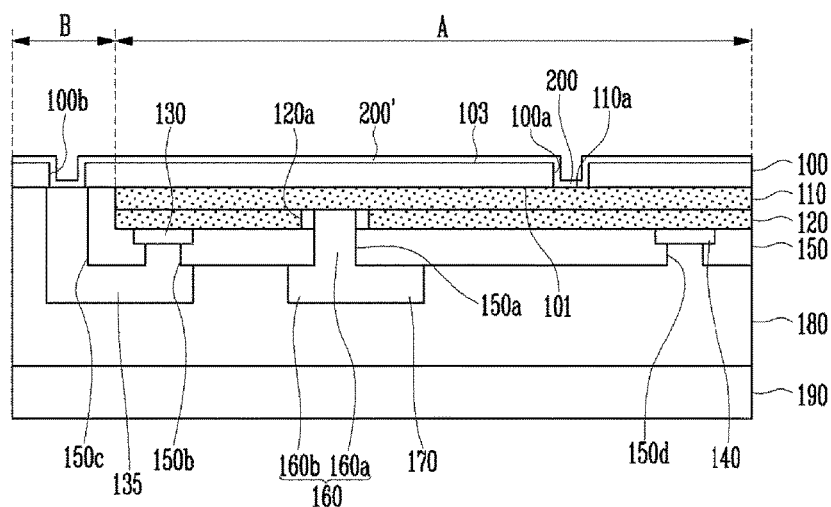

Referring to FIG. 13, the metal layer 200' may be formed on the second surface 103 of the substrate 100 including the first via hole 100a and the second via hole 100b. The metal layer 200' may include the second field electrode 200 contacting the rear surface 110a of the active layer 110 through the first via hole 100a. In addition, the metal layer 200' may be electrically connected to the pad portion 135 through the second via hole 100b.

The second field electrode 200 and the metal layer 200' may include at least one of metal including a conductive material, alloy, conductive oxide, or conductive metal nitride. For example, the second field electrode 200 may include a single layer including one of titanium (Ti), aluminum (Al), platinum (Pt), gold (Au), nickel (Ni), and chromium (Cr), a plurality of layers including more than one material, or an alloy thereof. In addition, conductive layers having a thickness of several micrometers (μm) may be formed by a plating process as the metal layer 200' and the second field electrode 200.

The metal layer 200' may be electrically connected to the pad portion 135 through the second via hole 100b. The second field electrode 200 may be electrically connected to the source electrode 130 through the metal layer 200' and the pad portion 135.

When the metal layer 200' is in a ground state, the second field electrode 200, the pad portion 135, and the source electrode 130 may be in ground states.

Figure 14:
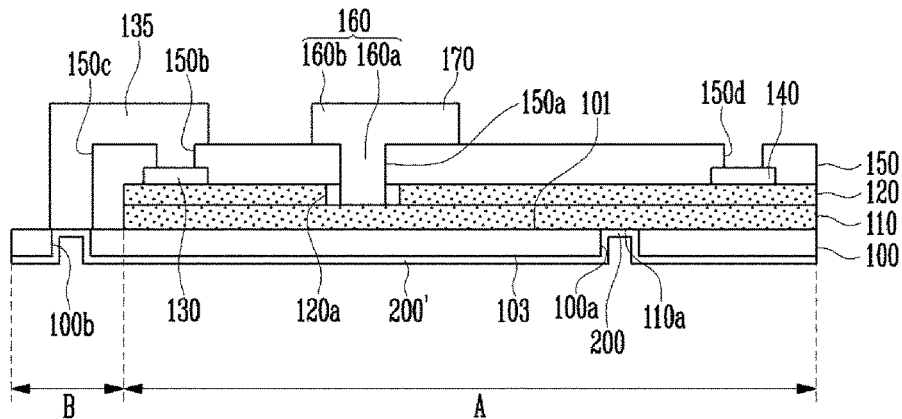

Referring to FIG. 14, after the carrier wafer 190 as shown in FIG. 13 is separated from the first surface 101 of the substrate 100, the adhesive material 180 as shown in FIG. 13 may be removed by performing a cleaning process.

By the above-described manufacturing method, the high electron mobility transistor according to an embodiment may form the first field electrode 170 on the first surface 101 of the substrate 100 and the second field electrode 200 on the second surface 103, so that leakage current may be reduced, a breakdown voltage may be increased, and a current collapse phenomenon may be improved.

Figure 15:
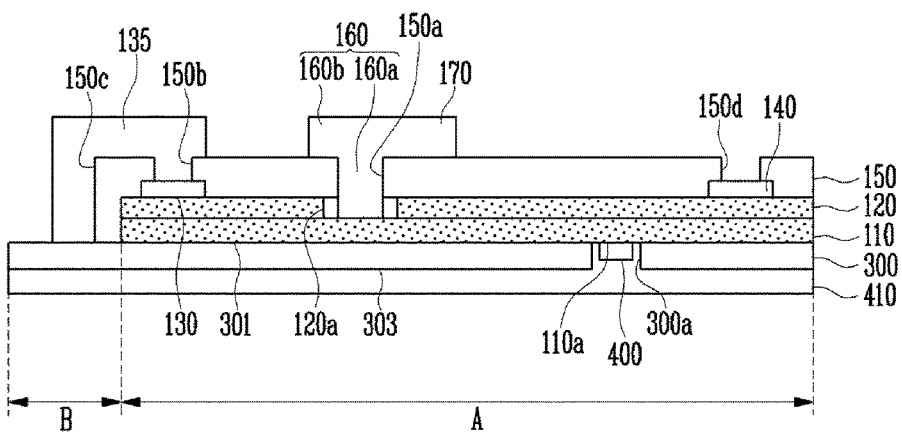
FIG. 15 is a cross-sectional diagram illustrating a high electron mobility transistor according to another embodiment.

FIG. 15 is a cross-sectional diagram illustrating a high electron mobility transistor according to another embodiment. Differences of a high electron mobility transistor according to another embodiment from the high electron mobility transistor according to the earlier described embodiment are mainly described to omit a description of common contents with the earlier described embodiment. A description of portions which are not particularly described in this embodiment coincides with that of the high electron mobility transistor according to the earlier described embodiment. The same or like reference numerals refer to the same or similar elements.

Referring to FIG. 15, a high electron mobility transistor according to another embodiment may include a substrate 300, the active layer 110, the cap layer 120, the source electrode 130, the drain electrode 140, the insulating layer 150, the gate electrode 160, the first field electrode 170, the pad portion 135, a second field electrode 400 and a passivation layer 410. The cap layer 120 may be removed.

The substrate 300 may be a silicon (Si) substrate, a silicon carbide (SiC) substrate, a high-resistivity silicon substrate or a wafer an epi-structure such as nucleation layer and buffer layer. However, the substrate 100 may include various other materials. The substrate 300 may include the via hole 300a passing through the first surface (e.g., front surface 301) and the second surface (e.g., rear surface 303). As shown in FIG. 15, the via hole 300a may be formed by etching the substrate 300 corresponding to a region between the source electrode 130 and the drain electrode 140. In another example, though not shown in FIG. 15, the via hole 300a may be formed by etching a portion of the active layer 110 formed on the substrate 300 as well as the substrate 300 corresponding to the region between the source electrode 130 and the drain electrode 140.

The active layer 110 may be formed on the first surface 301 of the substrate 300 and form a channel region between the source electrode 130 and the drain electrode 140. The active layer 110 may be a semiconductor layer. The active layer 110 may include a semiconductor material layer (barrier layer) having polarization characteristics, energy bandgap and lattice constant, at least one of which is different from that of the semiconductor layer (buffer layer). The active layer 110 may have a structure forming a heterojunction of two materials.

The cap layer 120 may include the gate recess region 120a through which a portion of the active layer 110 is externally exposed.

The substrate 300 may include the device area A including the channel region formed by the active layer 110 and the isolation area B not including the channel region.

The source electrode 130 and the drain electrode 140 may form an ohmic contact on the cap layer 120. In addition, the source electrode 130 and the drain electrode 140 may form an ohmic contact on the active layer 110 when the cap layer 120 is removed.

The insulating layer 150 may be disposed on the source electrode 130 and the drain electrode 140 and include the opening 150a corresponding to the gate recess region 120a.

The gate electrode 160 may be disposed between the source electrode 130 and the drain electrode 140. The gate electrode 160 may include the gate foot 160a passing through the gate recess region 120a and the opening 150a, and the gate head 160b electrically connected to the gate foot 160a and disposed on the insulating layer 150. The gate foot 160a may contact the active layer 110.

The first field electrode 170 may be formed on the insulating layer 150, electrically connected to the gate head 160b, and extend in a direction of the drain electrode 140. The first field electrode 170 may reduce the peak value of the electric field around the drain-side edge of the gate electrode 160, enabling the high electron mobility transistor to be operated at high driving voltage.

The second field electrode 400 may be buried in the via hole 300a and arranged on the second surface 303 of the substrate 300. The second field electrode 400 may include a single layer including one of titanium (Ti), aluminum (Al), nickel (Ni), gold (Au), platinum (Pt), and chromium (Cr), a multilayer including more than one metal, or an alloy thereof. In addition, a conductive layer having a thickness of several micrometers (µm) or more may be formed as the second field electrode 400 by a plating process.

The second field electrode 400 may be electrically connected to the gate electrode 160 through a gate pad portion (not illustrated) located in the isolation area B. Therefore, the second field electrode 400 may be electrically connected to the gate electrode 160 to prevent a current collapse phenomenon and an increase in on-resistance.

The passivation layer 410 may be disposed on the second field electrode 400 and include silicon nitride (SiN), silicon oxide (SiO2), BCB (Benzocyclobutene) and a porous silica thin film. In addition, the passivation layer 410 may protect the second surface 303 of the substrate 300 and the second field electrode 400.

According to an embodiment, a high electron mobility transistor capable of reducing leakage current and improving a breakdown voltage may be provided by etching a rear surface of a substrate corresponding to a region between a source electrode and a drain electrode.

According to an embodiment, a high electron mobility transistor reducing a current collapse phenomenon may be fabricated by forming a back surface field electrode on a rear surface of the etched substrate and connecting the back surface field electrode to a source electrode or a gate electrode.

According to an embodiment, a method of easily manufacturing the high electron mobility transistor may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A high electron mobility transistor, comprising:
a substrate including a first surface and a second surface facing each other and having a via hole passing through the first surface and the second surface;
an active layer disposed on the first surface of the substrate;
a cap layer disposed on the active layer and including a gate recess region exposing a portion of the active layer;
a source electrode and a drain electrode disposed on one of the cap layer and the active layer and forming an ohmic contact;
an insulating layer disposed on the source electrode and the drain electrode and having on opening corresponding to the gate recess region to expose the gate recess region;
a first field electrode disposed on the insulating layer and located between the source electrode the drain electrode;
a gate electrode electrically connected to the first field electrode on the insulating later; and
a second field electrode disposed on the second surface of the substrate and contacting the active layer through the via hole.

2. The high electron mobility transistor of claim 1, wherein the second field electrode disposed on the second surface of the substrate corresponds to a region between the gate electrode and the drain electrode.

3. The high electron mobility transistor of claim 1, wherein the second field electrode is disposed in the via hole.

4. The high electron mobility transistor of claim 1, wherein the via hole passes through the substrate and the portion of the active layer arranged on the substrate.

5. The high electron mobility transistor of claim 4, wherein the second field electrode includes at least one of metal, a conductive material, an alloy, a conductive oxide, or a conductive metal nitride.

6. The high electron mobility transistor of claim 1, wherein the second field electrode is electrically connected to at least one of the source electrode or the gate electrode.

7. The high electron mobility transistor of claim 1, wherein the gate electrode and the first field electrode include a same material.

8. The high electron mobility transistor of claim 1, wherein the gate electrode comprises:
a gate foot passing through the gate recess region and the opening; and
a gate head supported by the gate foot and the insulating layer.

9. The high electron mobility transistor of claim 8, wherein the first field electrode extends in a direction from the gate head to the drain electrode.

10. The high electron mobility transistor of claim 1, further comprising a passivation layer disposed on the second field electrode.

* * * * *